United States Patent

Machui

Patent Number: 5,396,200
Date of Patent: Mar. 7, 1995

[54] INTERDIGITAL TRANSDUCER WITH FINGER-WIDTH WEIGHTING FOR SURFACE WAVE ARRANGEMENTS

[75] Inventor: Jürgen Machui, München, Germany

[73] Assignee: Siemens Aktiengesellschaft, Munich, Germany

[21] Appl. No.: 960,438

[22] PCT Filed: Jun. 13, 1991

[86] PCT No.: PCT/DE91/00496
§ 371 Date: Dec. 9, 1992
§ 102(e) Date: Dec. 9, 1992

[87] PCT Pub. No.: WO91/20127
PCT Pub. Date: Dec. 26, 1991

[30] Foreign Application Priority Data

Jun. 13, 1990 [DE] Germany .......... 40 19 004.8

[51] Int. Cl.⁶ .......... H03H 9/64
[52] U.S. Cl. .......... 333/196; 310/313 B
[58] Field of Search .......... 333/193, 194, 196; 310/313 R, 313 B, 313 C, 313 D

[56] References Cited

U.S. PATENT DOCUMENTS

| 3,868,608 | 2/1975 | Williams .................. 333/72 |
| 3,936,774 | 2/1976 | Mellon et al. . |
| 3,968,460 | 7/1976 | Moulding et al. .......... 333/196 |
| 3,979,702 | 9/1976 | Honsinger et al. .......... 333/196 |
| 3,990,023 | 11/1976 | Kodama .................. 333/30 R |
| 4,162,465 | 7/1979 | Hunsinger et al. . |
| 4,384,264 | 5/1983 | Kadota .................. 333/196 |
| 4,701,657 | 10/1987 | Grassl .................. 33/196 |
| 5,021,699 | 6/1991 | Dufilie .................. 310/313 B |

FOREIGN PATENT DOCUMENTS 0369835 5/1990 European Pat. Off. .
25 46 193 4/1976 Germany .

Primary Examiner—Robert J. Pascal
Assistant Examiner—Darius Gambino
Attorney, Agent, or Firm—Hill, Steadman & Simpson

[57] ABSTRACT

An interdigital transducer is weighted by means of finger-width weighting for surface wave arrangements. The weighting is produced by differing finger widths in conjunction with constant widths of finger gaps. Constant finger overlap length is preferably provided.

8 Claims, 2 Drawing Sheets

INTERDIGITAL TRANSDUCER WITH FINGER-WIDTH WEIGHTING FOR SURFACE WAVE ARRANGEMENTS

BACKGROUND OF THE INVENTION

The present invention relates to an interdigital transducer for surface wave arrangements having busbars, transducer fingers alternately connected to the busbars, and finger gaps between the transducer fingers.

Surface wave arrangements operating by means of acoustic waves which propagate in the surface of a substrate have been known for approximately two decades. Such arrangements are used as electronic filters instead of arrangements comprising inductors and capacitors. The interdigital transducers to be used as output or input transducers comprise a number of finger-shaped electrode strips which are arranged on the substrate surface in an interdigital assignment relative to one another. To be more precise, these fingers are (electrically) connected in an alternating fashion to one or the other busbar.

In order to have a filter with a prescribed filter curve, it has been known just as long to select the overlap lengths of the interdigital fingers of the transducer in a manner matched to the filter curve. This is thus the so-called overlap weighting.

Examples of overlap weighting are described in EP-A-0,188,263 and DE-A-2,546,193. Both examples have, moreover, a design such that the transducers are reflection-free. The finger widths and the finger gaps are positioned in a fundamentally lambda-periodic fashion. Individual offsets are required for the freedom from reflection.

A surface wave structure which can also be overlap-weighted is described in DE-A-4,010,310, which was not published prior to the date of filing the present application. In this structure, final fingers are provided which, with respect to their finger width and their finger spacing, have different dimensions by comparison with the other fingers of the structure. These divergently dimensioned fingers are not weighted and serve merely to suppress reflections which otherwise emanate from final fingers.

Also known is finger-omission weighting, the desired weighting of the transducer being realized by purposive omission of individual fingers of the transducer. Omitted fingers can be replaced in this case by non-alternating electrically connected fingers. Moreover, finger-offset weighting is known, in which individual prescribed fingers of a transducer are arranged offset with respect to the prescribed periodicity of the transducer. These fingers are therefore no longer exactly in phase with the transducer periodicity of the comparatively un-weighted interdigital transducer.

An example of a finger-omission weighting is described in EP-A-0,369,835. FIG. 7 of this printed publication shows an interdigital finger structure having fingers whose centerline spacings are non-periodic. The finger centerline spacing is 4.5 lambda at the ends of the transducer and 1 lambda at the center of the transducer, and spacings of other fingers have values between these multiples of the wavelength lambda. There are no special instructions for the finger gaps.

These types of weighting which have been mentioned above have been adequately described before, together with their advantages and disadvantages, in the prior art. Overlap weighting leads to problems in adhering to the aperture of a transducer. Many of the characteristics of the overlap-weighted transducer can be described only in two dimensions. In particular, the influence of manufacturing tolerances becomes strongly noticeable in the case of only small overlap lengths. This results frequently in problems in designing filters and in the reproducibility at critical points. Furthermore, it is only with reluctance that two overlap-weighted transducers are used directly opposite one another in a filter. To be precise, this is attended by the difficulty of having to correlate each individual excitation in the transducer operating as input transducer with each detecting overlap of the transducer operating as output transducer. It is known, for example in television band pass filters, to weight only one transducer and to provide the second transducer with a time signal which corresponds to a simple rectangle.

The method of finger-omission weighting, which is more rarely applied, in any case, has the disadvantage that the desired time signal cannot be effectively scanned, because all that is available for each overlap is to assign "ones" and "zeros", that is to say finger present and finger omitted, so that the dynamics of this weighting method are mostly unsatisfactory.

SUMMARY OF THE INVENTION

The aim of the invention which is to be described below is to eliminate the shortcomings of the prior art. It is thus the object of the present invention to specify a weighting method for interdigital transducers for surface wave arrangements by means of which the prescribed filter function to be realized can be better apportioned between input transducer and output transducer of the filter, and/or by means of which substantially weaker side lobes (secondary lobes) are to be achieved and/or by means of which better filter characteristics are to be obtained with the same substrate length without it being necessary to set up more stringent requirements with respect to manufacturing tolerances.

This object or its key problems respectively arising in the individual case is/are achieved in accordance with the present invention by means of an interdigital transducer which are periodically positioned with a constant width of the finger gaps at least in the region of the prescribed weighting of the transducer, wherein, starting from a mean dimension for which all transducer fingers are of equal width, in accordance with the prescribed weighting it is the case that in a weighting region the width of the transducer fingers of one busbar are equal to or greater than, and the width of the transducer fingers of the other busbar are equal to or narrower than this mean dimension. Finger gaps of equal width are provided which are positioned with their centers offset by comparison with the periodicity of the arrangement of the transducer fingers in accordance with the prescribed weighting, and the transducer fingers are essentially periodically positioned with reference to their respective center.

It remains to refer to an only apparently relevant prior art, that is, U.S. Pat. Nos. 3,936,774 and 4,162,465. Both U.S. Patents exhibit nonweighted structures. U.S. Pat. No. 3,936,774 relates to a dispersive structure having finger spacings differing in accordance with the band width. U.S. Pat. No. 4,162,465 relates to a transducer in which the differing finger positioning and differing finger width are periodic over the transducer. That is to say, no weighting is present in this regard.

This design of transducer serves to generate in the transducer a specific reflected wave component which interferes with a signal component which is based on the electrical signal reflection at the load impedance.

A new weighting method, which consists in a width variation of the interdigital fingers provided on the transducer, has been found for the present invention. This new finger weighting is only apparently along the lines of the known finger-offset weighting. In fact, this new method of finger weighting has different physical foundations. In the present invention, the strip-shaped gaps between two adjacent transducer fingers uniformly have an identical width in principle (in the direction of the principal direction of wave propagation). The individual fingers of the transducer are, by contrast, of differing widths in accordance with the measure of the local weighting in the transducer. The wavelength, resulting in the material of the substrate, of the acoustic wave occurring for the center frequency of the filter in the transducer determines the periodicity p (=lambda) of the wave in the principal direction of wave propagation (orthogonal to the alignment of the fingers). The transducer fingers of an interdigital transducer weighted according to the invention are (at least in one region of the transducer) positioned such that the center points of the transducer fingers, seen in the direction of the width of the fingers, that is to say seen in the principal direction of wave propagation, correspond to this periodicity 2p. That is to say, the periodicity measure p/2 is always adhered to from the center of one finger to the center of the respectively adjacent finger. This is precisely not the case in the known finger-offset weighting.

In a transducer according to the invention, low activity is present wherever particularly wide fingers of one busbar, that is to say of one polarity, alternate with particularly narrow fingers of the other busbar. In a finger-length-weighted transducer this would be the region of small overlap lengths having a large diffraction effect. This disadvantageous diffraction effect is ruled out in the invention.

Compared to transducers having known finger weighting, it is frequently the case that transducers weighted according to the invention have a width of the gap between adjacent fingers which is smaller than corresponds to known transducers with dimensions for which the finger width is equal to the width of the finger gap, that is to say respectively lambda/4.

For example, it is provided in the invention to select the width of the finger gaps, which remains of large dimension, to the width of the widest finger width occurring in the weighted transducer. Given a present, technically dictated limit of 0.5 μm to the optical resolution in the production of finger structures, this means that transducers weighted according to the invention can easily have center frequencies into the range of 500 MHz. In particular, the entire range of television intermediate-frequency filters is easily covered.

A transducer according to the invention generally has the same finger length throughout. Despite low transducer weighting at the start and at the end of such a transducer, aperture thereof is not changed.

In the case of the invention, however, the centers of the finger gaps are not positioned in accordance with the periodicity p.

In the case of the invention, the finger-width weighting according to the invention can also further have a certain measure of finger-overlap weighting superimposed, by means of which a larger weighting margin is to be obtained. The overlap measure then provided is, however, kept very restricted, that is to say a minimum overlap length is always adhered to, in order to continue to rule out undesired diffraction effects at the ends of the transducer, or to restrict them in a prescribed fashion.

Additional features and advantages of the present invention are described, and will be apparent from, the detailed description of the presently preferred embodiments and from the drawings.

DETAILED DESCRIPTION OF THE PREFERRED EMBODIMENTS

Further explanations of the invention emerge from the following description relating to the figures, in which embodiments are specified.

Figure 1:
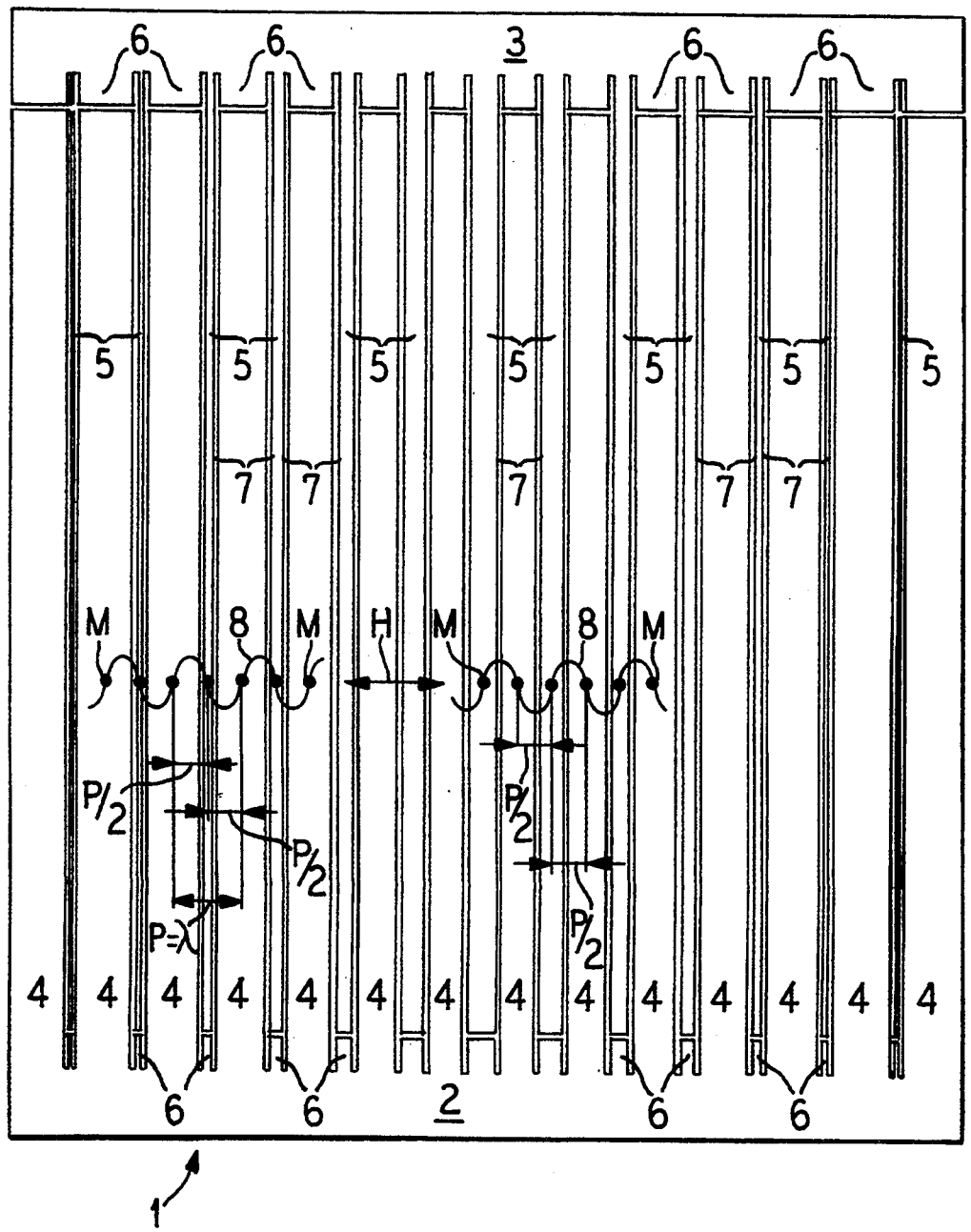
FIG. 1 is a diagram of the principle of a transducer weighted according to the invention with low weighting at each end of the transducer.

FIG. 1 shows a diagram of the principle of a transducer weighted according to the invention with low weighting at each end of the transducer. With regard to weighting alone, that is to say apart from the side effects in transducers weighted in a known fashion, the transmission curve or the time signal of this transducer of FIG. 1 is equivalent to the meandering line, specified in FIG. 2, of a finger-length weighted interdigital transducer.

In FIG. 1, 1 designates the interdigital transducer, and 2 and 3 the two mutually opposite busbars. 4 designates the fingers connected to the busbar 2, and 5 the fingers connected to the busbar 3.6 designates the known dummy fingers. 7 refers to the gaps, mentioned frequently above, between the adjacent fingers 4 and 5. The undulating line designated by 8 and plotted in FIG. 1 is the periodicity, thus revealed in the direction of the principal direction of wave propagation H, with p=lambda of the acoustic wavelength of the wave which is emitted by the transducer 1 on or in the surface of the substrate. Clearly, the centers, revealed by large points, of the widths of the fingers 4 and 5 coincide essentially with the "zero crossings" of the undulating line 8. This is characteristic of the invention and distinguishes it essentially from the prior art.

Figure 2:
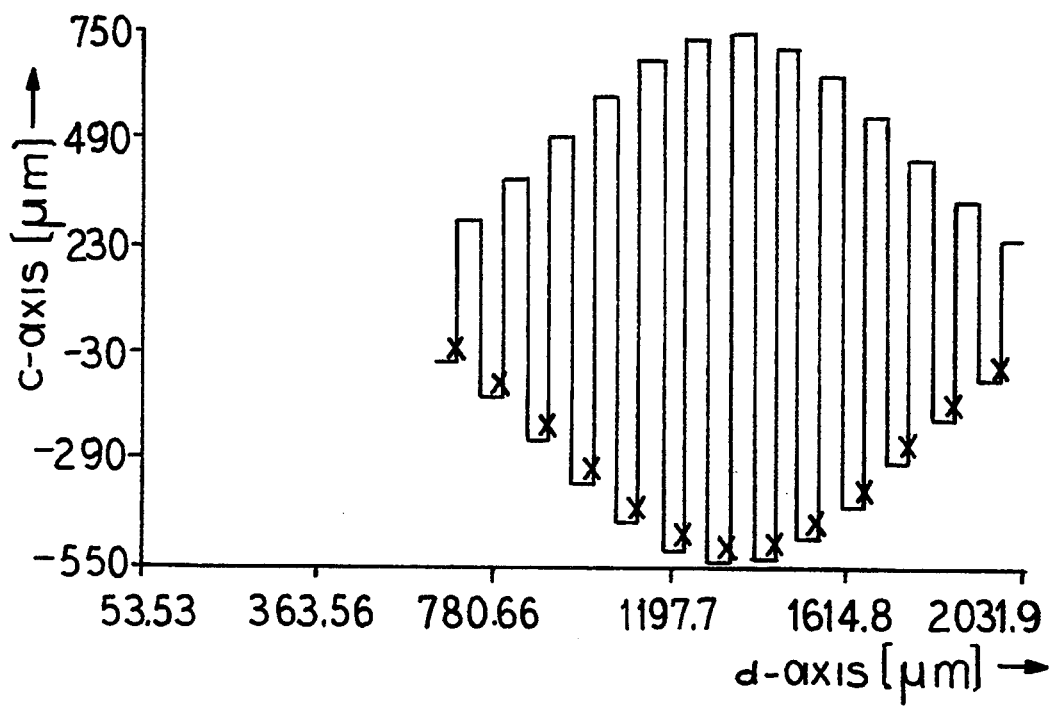
FIG. 2 is a graph of a finger-length weighted interdigital transducer.
Figure 3:
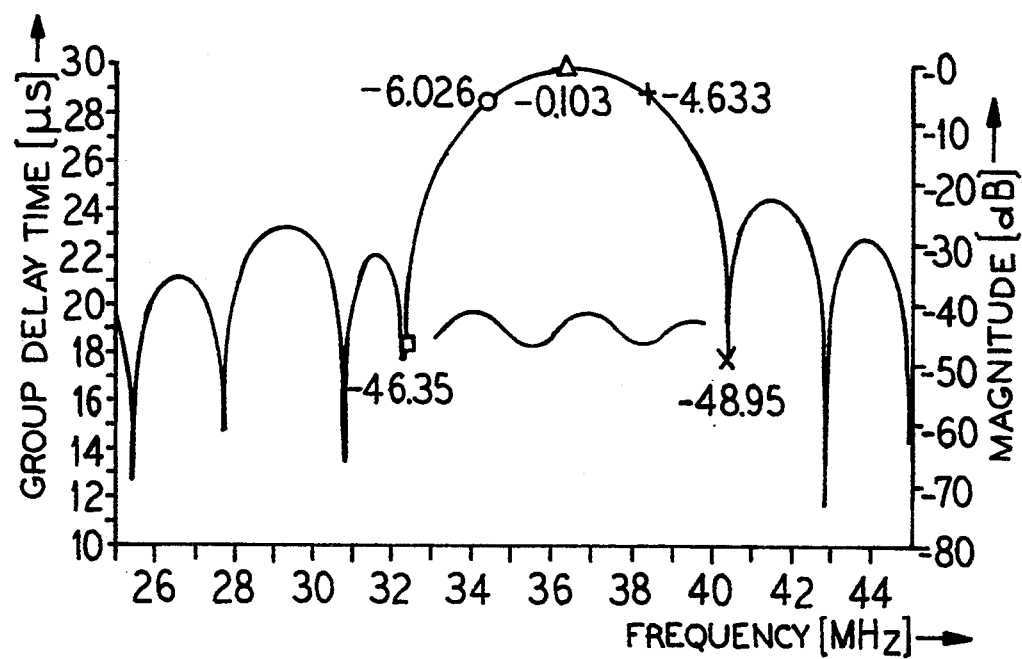
FIG. 3 is a graph of the Fourier transform of the time signal resulting from the charge distribution present during operation in the transducer of FIG. 1.

The meandering curve of the finger-length weighting of the transducer according to FIG. 1 is plotted in FIG. 2, which has already been mentioned. The diagram of FIG. 2 does not, of course, differ from the prior art, since apart from undesired side effects, the invention must, after all, perform according to the prior art with respect to the filter curve achieved by weighting. FIG. 3 shows the transfer function of a transducer according to FIG. 1, as seen with respect to a single overlap of the second associated transducer of the filter. The transfer function shown in FIG. 3 is essentially the Fourier transform of the time signal which is set up (as a result of the charge distribution present during operation in a transducer according to FIG. 1) along the principal direction of wave propagation H of the acoustic wave in the transducer.

As is clear from FIG. 1, the fingers 4 of one busbar 2 are equally wide or wider than a mean dimension of the finger width. The fingers 4, 5 of the two busbars 2, 3 are equally wide in the center of the transducer (where the highest weighting prevails). This mean dimension is equal to one-half the period length p/2, decreased by the width of a finger gap 7. Low weighting prevails where the finger widths differ particularly strongly from this mean dimension (at the transducer ends).

The assignment of wider fingers (for example finger 4) to one busbar (2), and of narrower fingers (for example finger 5) to the other busbar (2) can also be partially interchanged inside a transducer (narrower fingers on one busbar and then wider fingers on the other busbar). "Essentially" periodically positioned is to be understood such that given a finger width varies from finger to finger of a busbar. The exact geometrical center M of a finger is offset somewhat in the direction in which the widths of the fingers increase.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

I claim:

1. A weighted interdigital transducer for surface wave arrangements comprising:
   a first bus bar and a second bus bar;
   first transducer fingers, each having a first width, connected to the first bus bar;
   second transducer fingers, each having a second width, connected to the second bus bar;
   interspaces situated between the first and second transducer fingers having a constant width, the interspaces shifting in a main propagation direction of surface acoustic waves such that the first width of each of the first transducer fingers increase as the second width of each of the second transducer fingers decrease.

2. The interdigital transducer as claimed in claim 1, wherein the transducer fingers having a constant finger-length overlap at least in the weighted region.

3. The interdigital transducer with finger weighting as claimed in claim 1, wherein additionally superimposed finger-length overlap weighting is provided.

4. A surface wave filter with an input transducer having a first plurality of fingers, each of the first plurality of fingers having a first width, and an output transducer having a second plurality of fingers, each of the second plurality of fingers having a second width, wherein said first and second plurality of fingers are weighted proportionately and are periodically positioned with a constant width of gaps at least in a region of a prescribed weighting of the first and second plurality of fingers wherein starting from a mean dimension for which said first and second plurality of fingers are of equal width, in accordance with the prescribed weighting in a weighting region, the first width of each of the first plurality of fingers is equal to or greater than the mean and the second width of each of the second plurality of fingers is equal to or narrower than said mean dimension, and gaps of equal widths are provided which are positioned with their centers offset by comparison with the periodicity of the first and second plurality of fingers in accordance with the prescribed weighting, and the first and second plurality of fingers are essentially periodically positioned with reference to their respective centers.

5. The surface wave filter of claim 4 wherein said first and second plurality of fingers have a constant length overlap at least in the weighting region.

6. A weighted interdigital transducer for surface wave arrangements comprising:
   a first bus bar and a second bus bar;
   first transducer fingers, each having a first width, connected to the first bus bar;
   second transducer fingers, each having a second width, connected to the second bus bar;
   interspaces situated between the first and second transducer fingers having a constant width, the interspaces shifting in a main propagation direction of surface acoustic waves such that the first width of each of the first transducer fingers increase as the second width of each of the second transducer fingers decrease wherein additionally superimposed finger-length overlap weighting is provided.

7. A surface wave filter with an input transducer having a first plurality of fingers, each of the first plurality of fingers having a first width, and an output transducer having a second plurality of fingers, each of the second plurality of fingers having a second width, wherein said first and second plurality of fingers are weighted proportionately and are periodically positioned with a constant width of gaps at least in a region of a prescribed weighting of the first and second plurality of fingers wherein starting from a mean dimension for which said first and second plurality of fingers are of equal width, in accordance with the prescribed weighting in a weighting region, the first width of each of the first plurality of fingers is equal to or greater than the mean dimension, and the second width of each of the second plurality of fingers is equal to or narrower than said mean dimension, and gaps of equal widths are provided which are positioned with their centers offset by comparison with the periodicity of the first and second plurality of fingers in accordance with the prescribed weighting, and the first and second plurality of fingers are essentially periodically positioned with reference to their respective centers wherein additional superimposed length overlap weighting is provided.

8. The surface wave filter of claim 4 wherein additional superimposed length overlap weighting is provided.

* * * * *